US011284524B2

(12) United States Patent
Schuler

(10) Patent No.: US 11,284,524 B2
(45) Date of Patent: Mar. 22, 2022

(54) PRINTED CIRCUIT BOARD ASSEMBLY AND PACKAGING METHOD THEREOF, AND MOTOR VEHICLE

(71) Applicant: VALEO COMFORT AND DRIVING ASSISTANCE, Créteil (FR)

(72) Inventor: Stephane Schuler, Shenzhen (CN)

(73) Assignee: VALEO COMFORT AND DRIVING ASSISTANCE, Créteil (FR)

( * ) Notice: Subject to any disclaimer, the term of this patent is extended or adjusted under 35 U.S.C. 154(b) by 66 days.

(21) Appl. No.: 16/612,492

(22) PCT Filed: May 23, 2018

(86) PCT No.: PCT/EP2018/063532
§ 371 (c)(1),
(2) Date: Nov. 11, 2019

(87) PCT Pub. No.: WO2018/215555
PCT Pub. Date: Nov. 29, 2018

(65) Prior Publication Data
US 2020/0077528 A1    Mar. 5, 2020

(30) Foreign Application Priority Data
May 25, 2017    (CN) .......................... 201710381610.4

(51) Int. Cl.
*H05K 5/00*    (2006.01)
*B60R 16/02*    (2006.01)
*H05K 3/28*    (2006.01)

(52) U.S. Cl.
CPC ........... *H05K 5/0034* (2013.01); *B60R 16/02* (2013.01); *H05K 3/284* (2013.01); *H05K 5/0073* (2013.01); *H05K 2203/1327* (2013.01)

(58) Field of Classification Search
CPC .... H05K 5/0034; H05K 3/284; H05K 5/0073; H05K 2203/1327; H05K 5/006; B60R 16/02
See application file for complete search history.

(56) References Cited

U.S. PATENT DOCUMENTS 5,416,358 A * 5/1995 Ochi .................... G06K 19/077
257/666
5,738,528 A * 4/1998 Matsuoka ......... H01L 21/67333
439/41

(Continued)

FOREIGN PATENT DOCUMENTS

| CN | 1856229 A | 11/2006 |
| CN | 101692441 A | 4/2010 |

(Continued)

OTHER PUBLICATIONS

International Search Report and Written Opinion in corresponding in International Application No. PCT/EP2018/063532, dated Jun. 12, 2018 (13 pages).

(Continued)

*Primary Examiner* — Hung S. Bui
*Assistant Examiner* — Sagar Shrestha
(74) *Attorney, Agent, or Firm* — Osha Bergman Watanabe & Burton LLP

(57) ABSTRACT

Embodiments of the present invention provide a method for packaging a printed circuit board assembly (PCBA), a packaged PCBA module, and a motor vehicle. The method includes: providing a printed circuit board assembly comprising a printed circuit board (PCB) and a plurality of elements assembled on the printed circuit board; providing a support constructed to carry the printed circuit board assembly and define a space for accommodating the printed circuit board assembly; placing the printed circuit board assembly in the space of the support to enable the support to (Continued)

carry and position the printed circuit board assembly, and placing the support and the printed circuit board assembly carried thereby in a mould; and filling the mould with a polymer material using a moulding process so as to form a packaging structure encapsulating at least the printed circuit board assembly and fixing the printed circuit board assembly relative to the support.

22 Claims, 9 Drawing Sheets

(56) References Cited

U.S. PATENT DOCUMENTS

| | | | | |
|---|---|---|---|---|
| 6,180,045 | B1* | 1/2001 | Brandenburg | H05K 7/20854 264/263 |
| 6,307,749 | B1* | 10/2001 | Daanen | H05K 7/20854 361/704 |
| 6,807,731 | B2* | 10/2004 | Brandenburg | H05K 5/065 264/272.15 |
| 6,905,349 | B1* | 6/2005 | Brandenburg | H05K 3/284 439/79 |
| 7,213,328 | B2* | 5/2007 | Maruyama | H01R 43/0256 29/760 |
| 8,732,941 | B2* | 5/2014 | Schuetz | H01R 43/28 29/739 |
| 2002/0154486 | A1 | 10/2002 | Koike et al. | |
| 2006/0077643 | A1* | 4/2006 | Mayuzumi | H05K 3/284 361/753 |
| 2006/0139932 | A1 | 6/2006 | Park | |
| 2006/0171120 | A1* | 8/2006 | Mandel | H05K 5/065 361/704 |
| 2008/0158824 | A1* | 7/2008 | Aoki | H01L 24/40 361/711 |
| 2009/0085248 | A1* | 4/2009 | Brandenburg | H05K 5/0034 264/259 |
| 2013/0244454 | A1* | 9/2013 | Westman | H01R 13/6273 439/62 |
| 2014/0334117 | A1 | 11/2014 | Sano | |
| 2015/0366076 | A1* | 12/2015 | Colwell | B29C 70/26 361/761 |
| 2017/0105307 | A1* | 4/2017 | Braun | H05K 7/1474 |
| 2018/0183161 | A1* | 6/2018 | Soyano | H01R 4/70 |
| 2018/0354434 | A1* | 12/2018 | Kaneko | H05K 5/0056 |

FOREIGN PATENT DOCUMENTS

| | | |
|---|---|---|
| CN | 203659956 U | 6/2014 |
| DE | 10 2013 209352 A1 | 11/2014 |
| DE | 10 2016 204247 A1 | 10/2016 |
| EP | 2043413 A2 | 4/2009 |
| EP | 2916632 A1 | 9/2015 |

OTHER PUBLICATIONS

The First Office Action issued in corresponding Chinese Patent Application No. 201710381610.4, dated Dec. 10, 2019 (11 pages).

* cited by examiner

PRINTED CIRCUIT BOARD ASSEMBLY AND PACKAGING METHOD THEREOF, AND MOTOR VEHICLE

TECHNICAL FIELD

Embodiments of the present invention generally relate to the field of packaging and assembling electronic elements, and in particular to a printed circuit board assembly (PCBA) and a packaging method thereof, and a motor vehicle having the printed circuit board assembly.

BACKGROUND ART

In general, a printed circuit board assembly (PCBA) comprises a printed circuit board (PCB) and various elements assembled thereon, and is used in various applications to achieve multiple control operation functions. The printed circuit board assembly is usually accommodated or packaged in a packaging structure formed by a packaging material which includes, for example, a low-density material, such as a foaming material like foamed polypropylene (EPP); and such packaging structure provides mechanical and/or environmental isolation or protection for PCBA, and is intended to achieve functional components in such a way of realizing light weight and/or reducing the number of the components.

In order to install or assemble the packaged PCBA to other members, such as a vehicle frame or other frames, it is also desired to provide an additional fastening member on the packaging structure so as to achieve such installation or assembly. However, the packaging material usually cannot provide sufficient mechanical strength or features to provide or implement thereon a fixing structure for reliable installation or assembly.

SUMMARY OF THE INVENTION

An object of the present invention is to solve or overcome at least one of the above-mentioned and other problems and defects existing in the prior art.

The embodiments of the present invention provide a method for packaging a printed circuit board assembly (PCBA), the method including the steps of:

providing a printed circuit board assembly comprising a printed circuit board (PCB) and a plurality of elements assembled on the printed circuit board;

providing a support constructed to carry the printed circuit board assembly and define a space for accommodating the printed circuit board assembly;

placing the printed circuit board assembly in the space of the support to enable the support to carry and position the printed circuit board assembly, and placing the support and the printed circuit board assembly carried thereby in a mould; and filling the mould with a polymer material using a moulding process so as to form a packaging structure encapsulating at least the printed circuit board assembly and fixing the printed circuit board assembly relative to the support.

In an embodiment, the step of providing the support further includes providing, on the support, a fixing structure for fixing the packaged printed circuit board assembly to an external structure.

In an embodiment, said fixing structure is configured to cooperate with an external bracket so as to fix the packaged printed circuit board assembly to said external structure.

In an embodiment, said support forms a bracket configured to fix the packaged printed circuit board assembly directly to said external structure, by means of said fixing structure.

In an embodiment, providing the fixing structure includes integrally forming the fixing structure with the support.

In an embodiment, providing the fixing structure includes assembling a fastener, which is formed separately from the support, to the support.

In an embodiment, the step of providing the support further includes manufacturing the support from a material compatible with the polymer material.

In an embodiment, the polymer material includes a foaming material.

In an embodiment, the moulding process includes an over-moulding process or an insert-moulding process.

In an embodiment, the packaging structure forms an integral structure with the printed circuit board assembly and the support.

According to the embodiments of the present invention, further provided is a packaged printed circuit board assembly (PCBA) module, comprising:

a support defining a space and constructed to fix the packaged printed circuit board assembly to an external structure;

a printed circuit board assembly accommodated in the space and comprising a printed circuit board (PCB) and a plurality of elements assembled on the printed circuit board; and a packaging structure encapsulating at least the printed circuit board assembly and fixing the printed circuit board assembly relative to the support.

In an embodiment, the support is provided with a fixing structure for fixing the packaged printed circuit board assembly module to the external structure.

In an embodiment, the fixing structure includes a structure integrally formed with the support.

In an embodiment, said fixing structure is configured to cooperate with an external bracket so as to fix the packaged printed circuit board assembly to said external structure.

In an embodiment, said support forms a bracket configured to fix the packaged printed circuit board assembly directly to said external structure, by means of said fixing structure.

In an embodiment, the fixing structure includes a fastener formed separately from the support and assembled to the support.

In an embodiment, the material of the support is compatible with the material of the packaging structure. For example, the material of the packaging structure includes a foaming material.

In an embodiment, the packaging structure includes an over-moulding structure or an insert-moulding structure.

In some embodiments, the packaged printed circuit board assembly module is a constituent component of a motor vehicle or a component located in or on the motor vehicle.

The embodiments of the present invention further provide a motor vehicle comprising the packaged printed circuit board assembly module described in any one of the embodiments of the present invention.

Other objects and advantages of the present invention will be apparent from the following detailed description of the present invention with reference to the accompanying drawings, which helps to have a thorough understanding of the present invention.

BRIEF DESCRIPTION OF THE DRAWINGS

These and/or other aspects and advantages of the present invention will become apparent and should be readily understood from the following description of the preferred embodiments in conjunction with the accompanying drawings, in which.

DETAILED DESCRIPTION OF EMBODIMENTS

The embodiments of the present invention will be described in detail below in combination with the drawings. Identical or similar reference signs in the present description denote identical or similar components.

In addition, in the following detailed description, for purposes of explanation, numerous specific details are set forth in order to provide a thorough understanding of the embodiments of the present invention. However, it is apparent that one or more embodiments may also be practised without these specific details. In other cases, well-known structures and devices are embodied by means of illustration to simplify the drawings.

Figure 1:
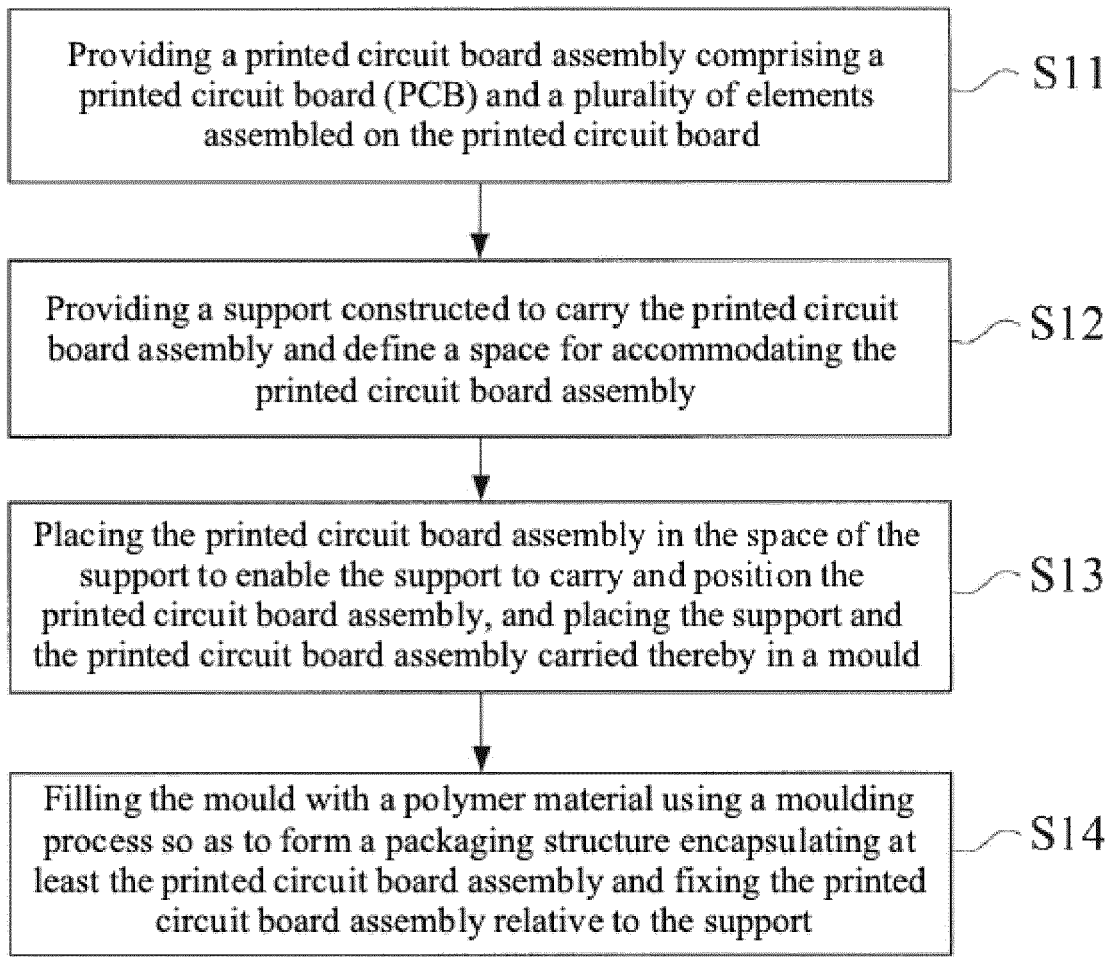
FIG. 1 schematically shows a flow chart of a method for packaging a printed circuit board assembly (PCBA) according to an embodiment of the present invention.

FIG. 1 schematically shows a process of a method for packaging a printed circuit board assembly (PCBA) according to an embodiment of the present invention. FIGS. 2-6 and FIGS. 2, 9-10 schematically show various steps of the method. As shown in the figures, the method includes:

step S11: providing a printed circuit board assembly (PCBA) comprising a printed circuit board (PCB) and a plurality of elements 12 assembled on the printed circuit board. In an embodiment, the plurality of elements 12 forms an electrical connector.

Figure 2:
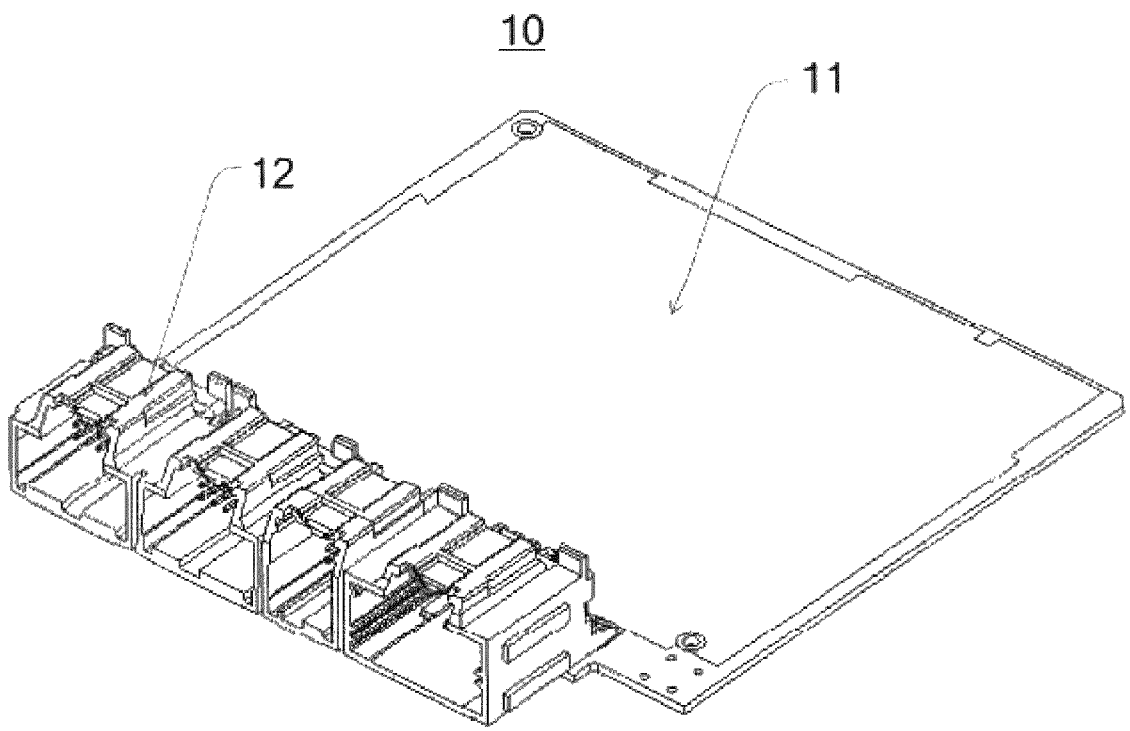
FIG. 2 schematically shows a perspective view of the structure of the printed circuit board assembly (PCBA) before packaged according to an embodiment of the present invention.

FIG. 2 shows an exemplary printed circuit board assembly (PCBA) 10 to be packaged or sealed, comprising a printed circuit board (PCB) 11 and a plurality of elements 12 assembled on the printed circuit board, such as various electrical elements, including but not limited to switches, illuminating devices, motors or display screens, etc. For clarity, FIG. 2 merely schematically shows an electrical connector 12 assembled or installed on the printed circuit board 11.

The method further includes:

step S12: providing a support 12 which is constructed to carry the printed circuit board assembly to be packaged and which can define a space 21 for accommodating the printed circuit board assembly to be packaged;

step S13: placing the printed circuit board assembly in the space of the support to enable the support to carry and position the printed circuit board assembly, and placing the support and the printed circuit board assembly carried thereby in a mould; and step S14: filling the mould with a packaging material using a moulding process so as to form a packaging structure encapsulating at least the printed circuit board assembly and fixing the printed circuit board assembly relative to the support.

Figure 3:
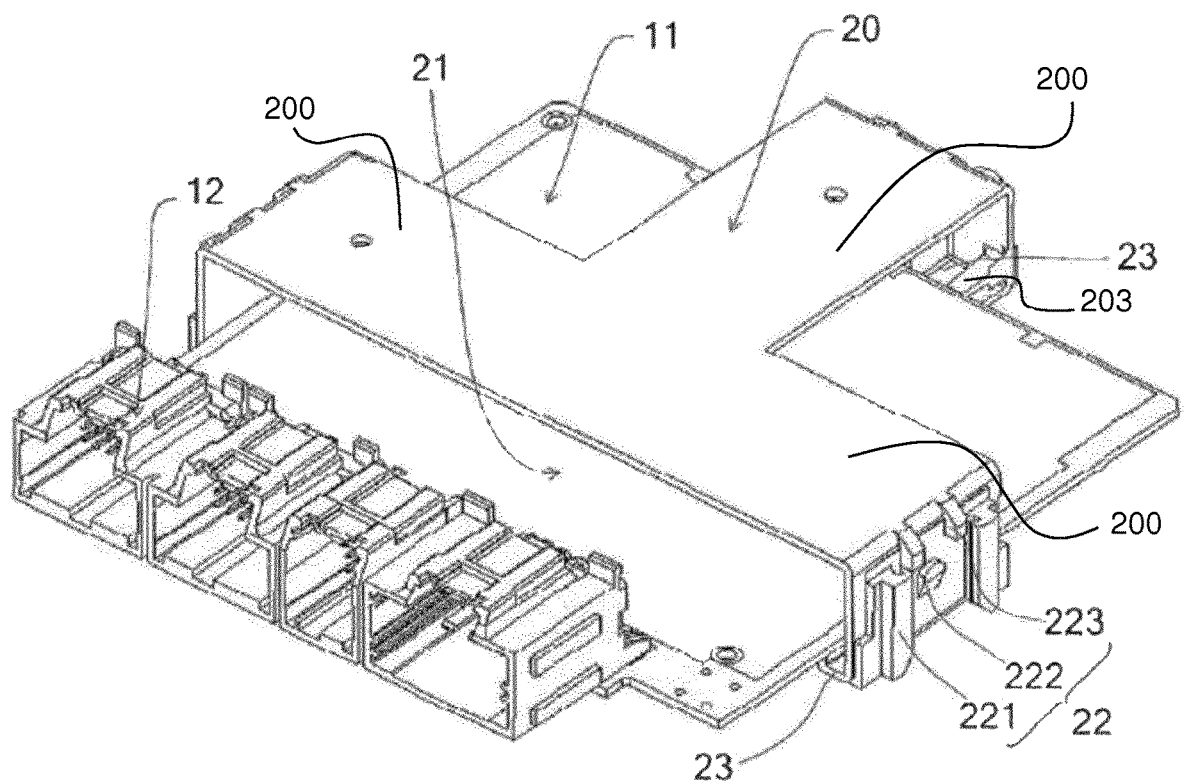
FIG. 3 schematically shows a perspective view of the structure of a support carrying the printed circuit board assembly (PCBA) according to an embodiment of the present invention.
Figure 9:
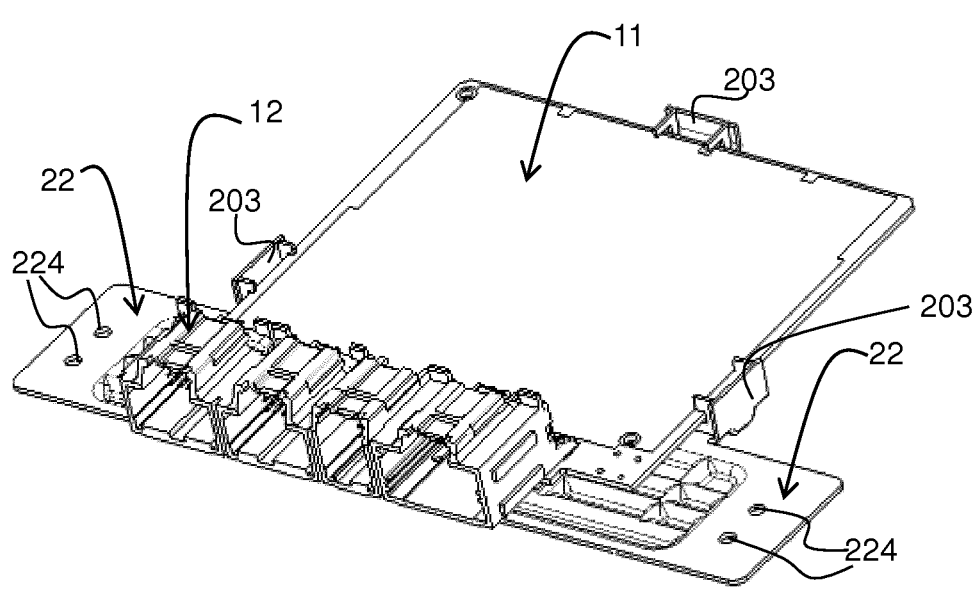
FIG. 9 schematically shows an upper perspective view of the structure of a support carrying the printed circuit board assembly (PCBA) and a plurality of elements according to another embodiment of the present invention.
Figure 10:
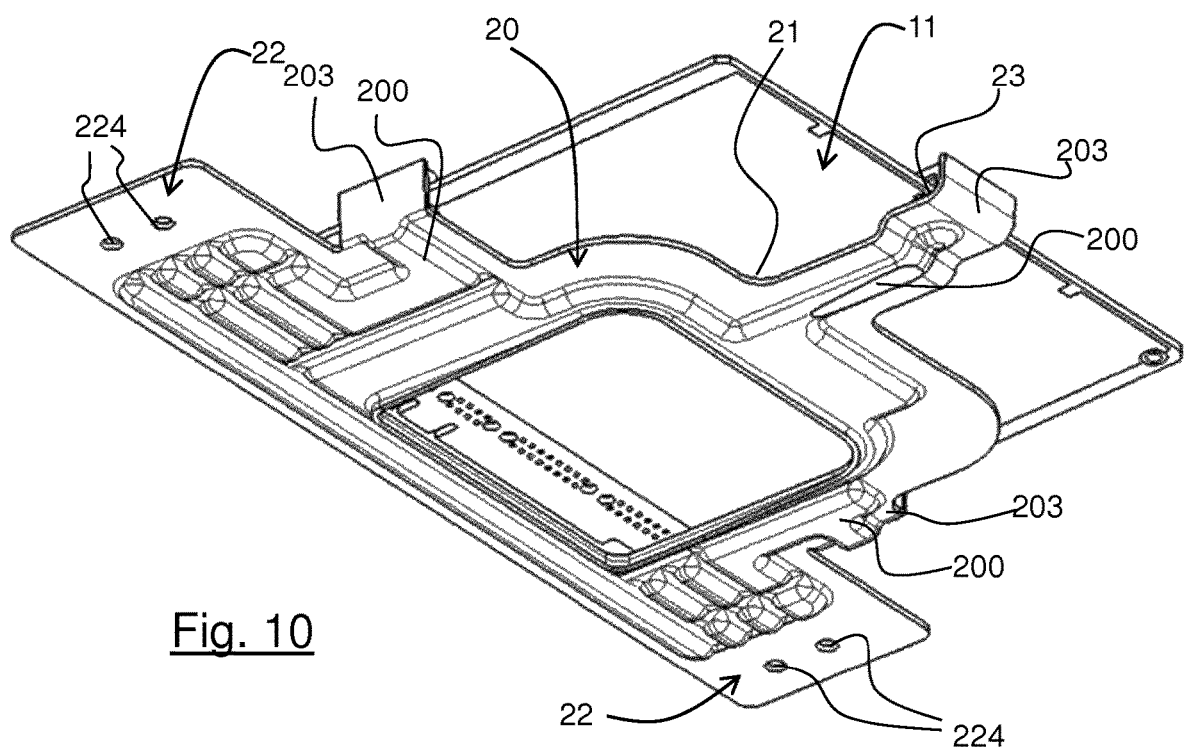
FIG. 10 schematically shows a bottom perspective view of the structure of a support carrying the printed circuit board assembly (PCBA) according to another embodiment of the present invention.

As shown in FIG. 3, FIG. 9 and FIG. 10, provided is a support 20 which is constructed to carry a printed circuit board assembly 10 to be packaged or carry at least a printed circuit board 11. The support 20 defines a space 21 for accommodating the printed circuit board assembly 10 to be packaged or the printed circuit board 11 thereof. In the illustrated embodiments, the support 20 is in the form of an open frame and comprises a plurality of, such as three, support arms 200 to carry the printed circuit board assembly 10 to be packaged or the printed circuit board 11 thereof at a plurality of locations 23. The shape or size of the support 20 matches the shape or size of the printed circuit board assembly 10 to be packaged or the printed circuit board 11 thereof, so as to stably carry the printed circuit board assembly 10. It should be understood that the specific structure and shape of the support is not limited herein, as long as the support is constructed to be able to appropriately carry and position the printed circuit board assembly.

Figure 8:
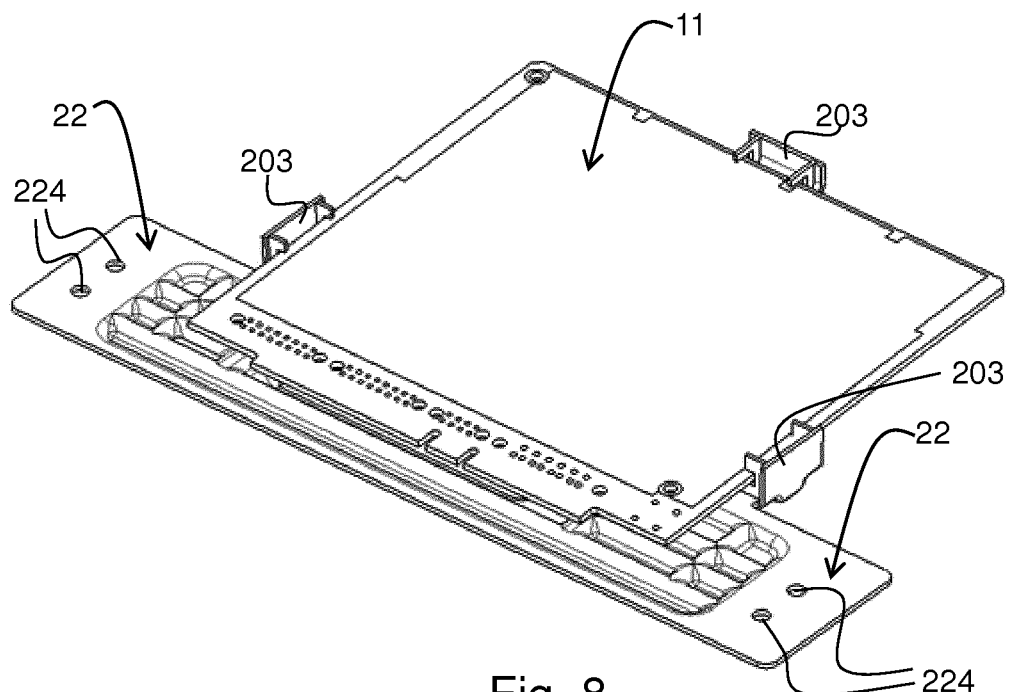
FIG. 8 schematically shows an upper perspective view of the structure of a support carrying the printed circuit board PCB) according to another embodiment of the present invention.

As shown in FIGS. 3, 8 and 9, each arm 200 includes a termination 203 configured to hook and locate said printed circuit board 11.

Subsequently, a moulding process is adapted to package the support 20 and the printed circuit board assembly 10 carried thereby. As used herein, a suitable moulding process includes, but is not limited to, an over-moulding process or an insert-moulding process.

Figure 4:
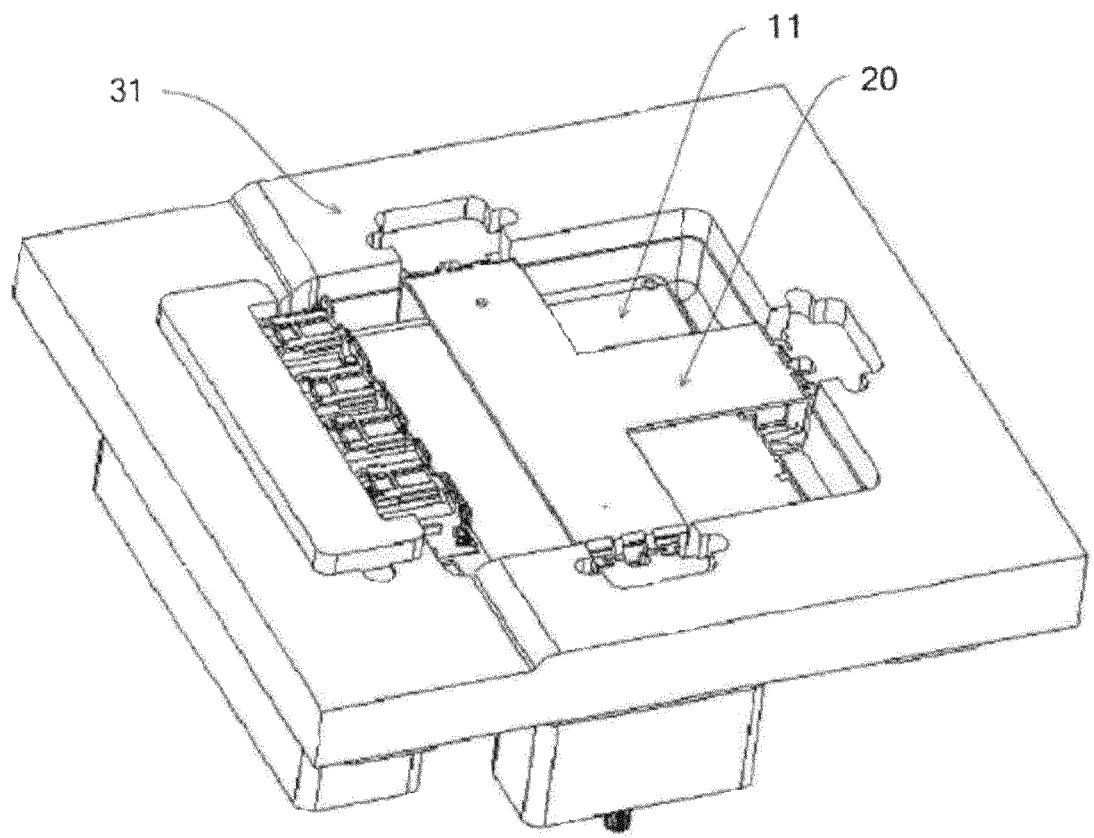
FIG. 4 schematically shows a perspective view of the support placed in a mould and the printed circuit board assembly (PCBA) carried in the support according to an embodiment of the present invention.
Figure 5:
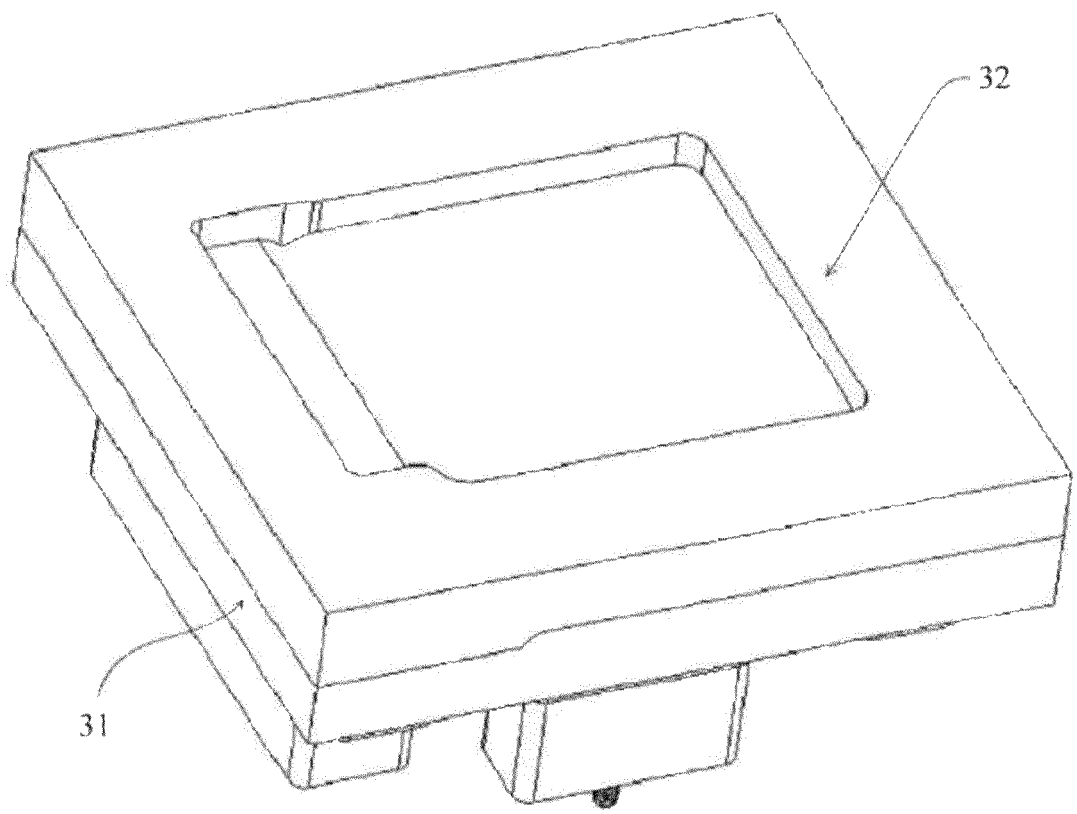
FIG. 5 schematically shows a perspective view of the state of the support placed in the mould and the printed circuit board assembly (PCBA) carried in the support that are packaged, according to an embodiment of the present invention.
Figure 6:
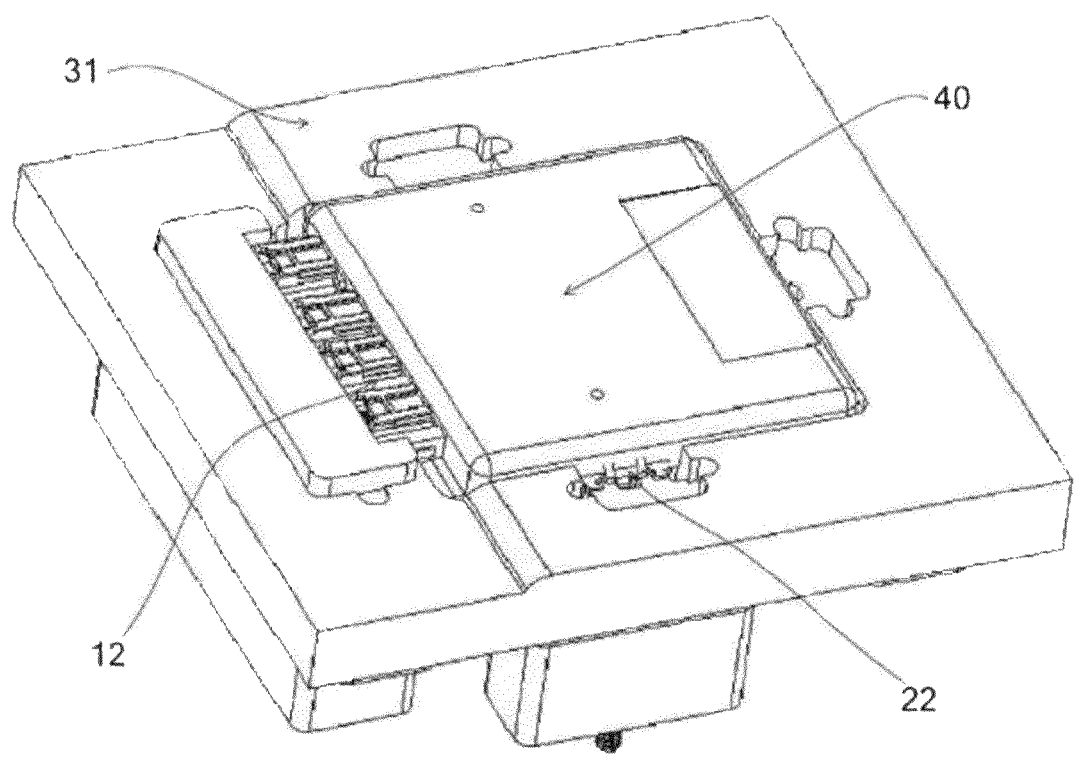
FIG. 6 schematically shows a perspective view of the state of the support placed in the mould and the printed circuit board assembly (PCBA) carried in the support, that have been packaged, after mould opening according to an embodiment of the present invention.
Figure 7:
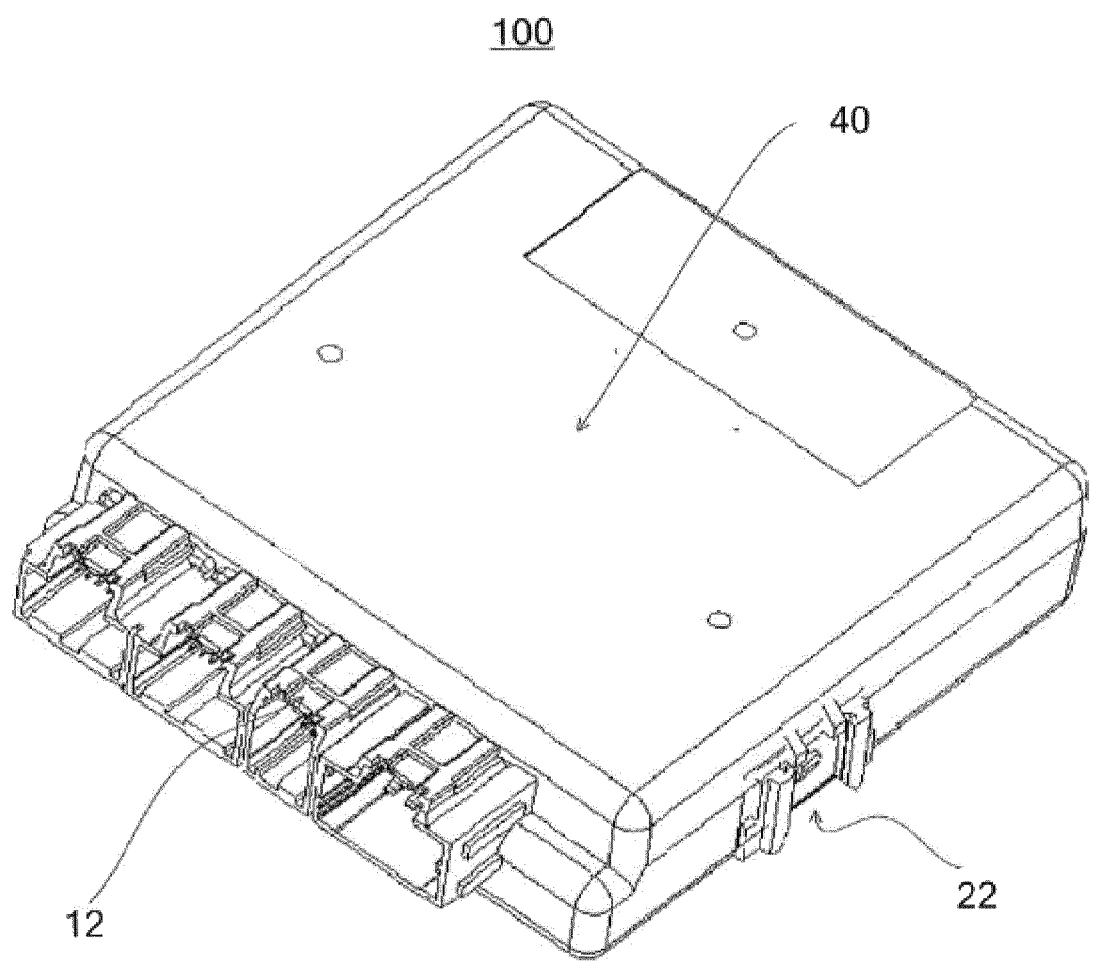
FIG. 7 schematically shows a perspective view of the structure of a packaged PCBA module according to an embodiment of the present invention.

For the embodiment with the support 12 and the printed circuit board assembly 10 of FIG. 3, as shown in FIGS. 4 and 5, a lower mould 31 is provided, the support 20 and the printed circuit board assembly 10 carried thereby are placed in the lower mould 31, and then an upper mould 32 is provided and placed on the lower mould 31 for mould clamping. The lower mould 31 and the upper mould 32 collectively define a cavity for accommodating the support 20 and the printed circuit board assembly 10 carried thereby, and the cavity has a contour that matches the overall contour of the support 20 and the printed circuit board assembly 10 carried thereby. Then, a suitable packaging material is injected or filled into the cavity, and after cooling or curing, the packaging material forms a packaging structure 40 encapsulating at least the printed circuit board assembly 10 and fixing the printed circuit board assembly 10 relative to the support 20. Finally, mould opening is performed, the upper mould 32 is firstly removed, as shown in FIG. 6, and then the packaged printed circuit board assembly 10 and support 20 are released from the lower mould 31 to obtain a packaged PCBA module 100, as shown in FIG. 7. It can be seen that, during the moulding process, the support 20 positions and maintains the printed circuit board assembly in place, thus avoiding displacement of the printed circuit board assembly during the moulding process.

The same applied for another embodiment with the support 20 and the printed circuit board assembly 10 of FIG. 9. It is to be noted that the person skilled in the art knows how to manufacture a lower mould and an upper mould adapted to said other embodiment of FIG. 9 and FIG. 10. Therefore, the lower mould and the upper mould are not illustrated for said embodiment.

According to the embodiments of the present invention, by means of the moulding process, the packaging structure 40 tightly and snugly encapsulates the printed circuit board assembly 10 and the support 20, for example, the packaging structure 40 forms an integral structure or a one-piece structure with the printed circuit board assembly 10 and the support 20.

In the illustrated embodiments, the electrical connector 12 on the printed circuit board assembly 10 is not packaged but exposed from the packaging structure 40 so as to be connected to other electrical devices. However, in other embodiments, other elements or structures on the printed circuit board assembly can be exposed from the packaging structure as needed.

According to the embodiments of the present invention, step S12 of providing the support can further include providing, on the support 20, a fixing or assembling structure 22 that is configured to fix or assemble the packaged printed circuit board assembly to an external structure, such as a vehicle frame or other frames or shells. Thus, as the fixing or assembling structure 22 is provided on the support 20 rather than on the packaging structure 40, the packaged printed circuit board assembly can be securely and reliably fixed or assembled to the external structure without damaging the packaging structure, thus improving the product reliability.

As shown in an embodiment FIG. 3, the support 20 is provided with a plurality of fixing or assembling structures 22 including a guide rail 221, a buckle or a protrusion 222, 223, a recess, an opening, etc. A fixing or assembling structure 22 is configured to cooperate with an external bracket (not illustrated) so as to fix or assemble the packaged printed circuit board assembly 10 to an external structure such as a vehicle frame or other frames or shells. The external bracket is arranged on said external structure. Hence, said external brackets are configured to cooperate with said guide rail 221, buckle or protrusion 222, 223. Hence, said fixing or assembling structure 22 is not directly fixed or assembled to other structures, such as an external structure. In the non-limitative embodiment illustrated in FIG. 3, three fixing or assembling structures 22 are provided to respectively cooperate with three external brackets.

However, the present invention is not limited thereto and can also provide other suitable fixing or assembling structures as needed, such as screws or other threaded connection structures.

In some embodiments, the fixing or assembling structures 22 can be integrally or collectively formed with the support 20. For example, it is possible to form the support 20 and the fixing or assembling structure(s) 22 thereon, for example, as stated above, the guide rail, the buckle, the protrusion, the recess, the opening, the threaded structure, etc., by means of sheet stamping moulding or a moulding process. FIG. 3 shows the fixing or assembling structures 22 which are integrally or collectively formed with the support 20.

In other embodiments, a fastener that is formed separately from the support 20 can be assembled to the support 20, for example, mounting screws, guide rails, etc. onto the support 20, which is not particularly defined in the present invention.

As shown in another embodiment FIGS. 8 to 10, said support 20 forms a bracket configured to fix or assemble the packaged printed circuit board assembly 10 directly to an external structure such as a vehicle frame or other frames or shells, by means of said fixing structure 22.

Hence, the fixing or assembling structure 22 is configured to cooperate directly with other structures, such as an external structure. Hence, the support 20 permits to replace altogether the support 20 with a plurality of fixing or assembling structures 22 including a guide rail 221, a buckle or a protrusion 222, 223 of the embodiment of FIG. 3, and the external brackets. Hence, this other embodiment of FIGS. 8 to 10 avoids having external brackets on other structures, such as an external structure. It permits to reduce the cost for fixing or assembling the packaged printed circuit board assembly to an external structure and the weight of all the necessary elements for said fixing or assembling.

FIG. 8 shows the support 20 and a plurality of fixing or assembling structures 22 without the plurality of elements 12.

FIG. 9 shows the support 20 and a plurality of fixing or assembling structures 22 with the plurality of elements 12. In one embodiment, a fixing or assembling structure 22 includes at least one hole 224 arranged to receive a screw to be screwed to other structures, such as an external structure.

In the non-limitative embodiment illustrated in FIG. 8 and FIG. 9, two fixing or assembling structures 22 are provided each including two holes 224. The two fixing or assembling structures 22 are part of the support 20.

As shown in FIG. 9, the two fixing or assembling structures 22 are arranged on each side of the plurality of elements 12 so as to facilitate firmly assembling or fixing the packaged printed circuit board assembly (PCBA) to other structures, such as an external structure.

In some embodiments, the fixing or assembling structures 22 can be integrally or collectively formed with the support 20. For example, it is possible to form the support 20 and the fixing or assembling structure(s) 22 thereon, for example, as stated above, the guide rail, the buckle, the protrusion, the recess, the opening, the threaded structure, etc., by means of sheet stamping moulding or a moulding process. FIG. 10 shows the fixing or assembling structures 22 which are integrally or collectively formed with the support 20.

As shown in FIG. 7, the fixing or assembling structures or fasteners 22 are not packaged but exposed from the packaging structure 40 so as to facilitate firmly assembling or fitting the packaged printed circuit board assembly (PCBA) to other structures, such as an external structure, by means of external brackets. In some embodiments, before the printed circuit board assembly (PCBA) is packaged, the fixing or assembling structures or fasteners are provided or formed on the support 20. In other embodiments, after the printed circuit board assembly (PCBA) is packaged, suitable fixing or assembling structures or fasteners are provided on the support 20.

Figure 11:
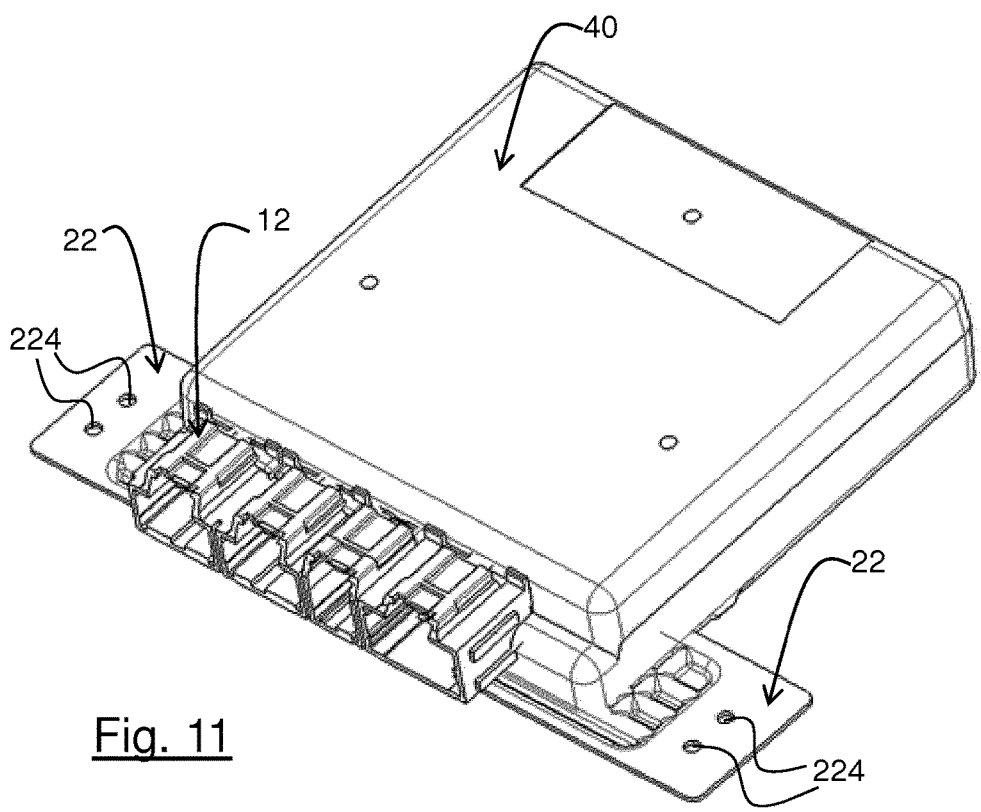
FIG. 11 schematically shows a perspective view of the structure of a packaged PCBA module according to another embodiment of the present invention.

As shown in FIG. 11, the fixing or assembling structures 22 are not packaged but exposed from the packaging structure 40 so as to facilitate firmly directly assembling or fitting the packaged printed circuit board assembly (PCBA) to other structures, such as an external structure. In some embodiments, before the printed circuit board assembly (PCBA) is packaged, the fixing or assembling structures 22 are provided or formed on the support 20.

In the embodiments of the present invention, the support 20 can be manufactured from a material compatible with the packaging material, that is, the material of the support 20 can be compatible with the packaging material, so that the support 20 can be adhered to or attached to the packaging material. In non-limitative embodiments, the support 20 can be manufactured from a metallic material or from a plastic material such as in a non-limitative example polypropylene. The polypropylene permits to reduce the weight of the packaged PCBA module 100. In the same manner, the plurality of elements 12 can be manufactured from a metallic material or from a plastic material such as in a non-limitative example polypropylene.

Illustratively, the packaging material for packaging the printed circuit board assembly can use a polymer material, for example, a low-density material, including but not limited to a foaming material such as foamed polypropylene (EPP). In some examples, the packaging material can be a thermoplastic material or a thermosetting material. In some other examples, the packaging material can be an insulating material. In other examples, the packaging material can include, for example, a transparent material suitable for light transmission, such as for the functions of illumination or decoration, or can be an opaque material or a reflective material.

As shown in FIGS. 2-7 and FIG. 2, 8-11, the embodiments of the present invention further provide a packaged PCBA module 100, which comprises the printed circuit board assembly (PCBA) 10, the support 20 and the packaging structure 40, wherein the printed circuit board assembly 10 is carried by the support 20 and comprises the printed circuit board (PCB) 11 and the plurality of elements 12 assembled on the printed circuit board 11, and the packaging structure 40 encapsulates at least the printed circuit board assembly 10 and fixes the printed circuit board assembly 10 relative to the support 20.

In the exemplary embodiments of the present invention, the fixing or assembling structure 22 is provided on the support 20 rather than on the packaging structure, thus the packaged printed circuit board assembly can be securely and reliably fixed or assembled to the external structure without damaging the packaging structure, thus improving the product reliability. Illustratively, the fixing or assembling structure 22 includes a structure integrally formed with the support 20. Alternatively or additionally, the fixing or assembling structure 22 includes a fastener formed separately from the support 20 and assembled to the support 20.

In an embodiment, the material of the packaging structure 40 includes a foaming material, and the material of the support 20 includes a material compatible with the material of the packaging structure. In another embodiment, the packaging structure 40 is an over-moulding structure or an insert-moulding structure.

In some embodiments, such a packaged PCBA module 100 can be a constituent component of a motor vehicle. However, it will be understood by those skilled in the art that the present invention is not limited to the application of motor vehicles, and such a packaged PCBA module can be applied in other fields, such as construction machinery, aircraft, vessels or other electronic devices.

Although the present invention has been described with reference to the accompanying drawings, the embodiments disclosed in the accompanying drawings are intended to illustrate the preferred embodiments of the present invention by means of examples, but are not to be construed as limiting the present invention. The dimensional proportions in the drawings are merely schematic and are not to be construed as limiting the present invention.

Although some embodiments of the general inventive concept have been displayed and described, it will be understood by those of ordinary skill in the art that changes may be made to these embodiments without departing from the principles and spirit of the general inventive concept, and the scope of the present invention is defined by the claims and their equivalents.

The invention claimed is:

1. A method for packaging a printed circuit board assembly, the method comprising:
    providing a printed circuit board assembly comprising a printed circuit board (PCB) and a plurality of elements assembled on the PCB;
    providing a support constructed to carry the printed circuit board assembly and define a space for accommodating the printed circuit board assembly, the support being in the form of an open frame and comprising a plurality of support arms at different dispositions on the frame to carry the printed circuit board assembly to be packaged;
    placing the printed circuit board assembly in the space of the support to enable the support to carry and position the printed circuit board assembly, and placing the support and the printed circuit board assembly carried thereby in a mould; and
    filling the mould with a packaging material using a moulding process so as to form a packaging structure encapsulating at least the printed circuit board assembly and fixing the printed circuit board assembly relative to the support,
    wherein the support is between a top portion of the packaging structure and the PCB.

2. The method according to claim 1, wherein providing the support further comprises providing, on the support, a fixing structure for fixing the packaged printed circuit board assembly to an external structure.

3. The method according to claim 2, wherein said fixing structure is configured to cooperate with an external bracket so as to fix the packaged printed circuit board assembly to said external structure.

4. The method according to claim 2, wherein said support forms a bracket configured to fix the packaged printed circuit board assembly directly to said external structure, by said fixing structure.

5. The method according to claim 1, wherein providing the fixing structure includes integrally forming the fixing structure with the support.

6. The method according to claim 1, wherein providing the fixing structure includes assembling a fastener, which is formed separately from the support, to the support.

7. The method according to claim 1, wherein providing the support further comprises manufacturing the support from a material compatible with the packaging material, so that the material of the support is adhered to or attached to the packaging material.

8. The method according to claim 1, wherein the packaging material includes a foaming material.

9. The method according to claim 1, wherein the moulding process includes an over-moulding process or an insert-moulding process.

10. The method according to claim 1, wherein the packaging structure forms an integral structure with the printed circuit board assembly and the support.

11. A motor vehicle comprising: the packaged printed circuit board assembly manufactured using the method of claim 1.

12. A packaged printed circuit board assembly module, comprising:
- a support defining a space and constructed to fix the packaged printed circuit board assembly module to an external structure, the support being in the form of an open frame and comprising a plurality of support arms at different dispositions on the frame to carry the printed circuit board assembly to be packaged;
- a printed circuit board assembly accommodated in the space and comprising a printed circuit board (PCB) and a plurality of elements assembled on the PCB; and
- a packaging structure encapsulating at least the printed circuit board assembly and fixing the printed circuit board assembly relative to the support,
- wherein the support is between a top portion of the packaging structure and the PCB.

13. The packaged printed circuit board assembly module according to claim 12, wherein the support is provided with a fixing structure for fixing the packaged printed circuit board assembly module to the external structure.

14. The packaged printed circuit board assembly module according to claim 13, wherein said fixing structure is configured to cooperate with an external bracket so as to fix the packaged printed circuit board assembly module to said external structure.

15. The packaged printed circuit board assembly module according to claim 13, said support forms a bracket configured to fix the packaged printed circuit board assembly module directly to said external structure, by said fixing structure.

16. The packaged printed circuit board assembly module according to claim 13, wherein the fixing structure includes a structure integrally formed with the support.

17. The packaged printed circuit board assembly module according to claim 13, wherein the fixing structure includes a fastener formed separately from the support and assembled to the support.

18. The packaged printed circuit board assembly module according to claim 12, wherein the material of the support is compatible with the material of the packaging structure, so that the material of support being adhered to or attached to the material of the packaging structure.

19. The packaged printed circuit board assembly module according to claim 12, wherein the material of the packaging structure includes a foaming material.

20. The packaged printed circuit board assembly module according to claim 12, wherein the packaging structure includes an over-moulding structure or an insert-moulding structure.

21. The packaged printed circuit board assembly module according to claim 12, wherein the packaged printed circuit board assembly module is a constituent component of a motor vehicle.

22. A motor vehicle comprising: the packaged printed circuit board assembly module according to claim 12.

* * * * *